United States Patent
Wang et al.

(10) Patent No.: US 6,515,542 B1
(45) Date of Patent: Feb. 4, 2003

(54) DIFFERENTIAL INTERMEDIATE FREQUENCY (IF) AMPLIFIER WITH NARROW BAND NOISE DITHERING FOR DRIVING HIGH SPEED ANALOG-TO-DIGITAL CONVERSION AND COMMUNICATION APPLICATIONS

(75) Inventors: Yi Wang, Summerfield, NC (US); James Hand, Greensboro, NC (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 09/859,189

(22) Filed: May 16, 2001

Related U.S. Application Data

(60) Provisional application No. 60/207,574, filed on May 26, 2000.

(51) Int. Cl.[7] .............................. H03F 3/45; H03M 1/20
(52) U.S. Cl. ......................................... 330/69; 341/131
(58) Field of Search ............................ 330/69; 341/131, 341/126

(56) References Cited

U.S. PATENT DOCUMENTS

| | | | | |
|---|---|---|---|---|
| 5,148,163 A | * | 9/1992 | Frindle | 341/131 |
| 5,451,900 A | * | 9/1995 | Haga et al. | 330/251 |
| 6,064,328 A | * | 5/2000 | Scheidig et al. | 341/131 |

FOREIGN PATENT DOCUMENTS

| | | | | |
|---|---|---|---|---|
| JP | 408249603 A | * | 9/1996 | H03G/5/12 |

* cited by examiner

*Primary Examiner*—Robert Pascal
*Assistant Examiner*—Khanh Van Nguyen
(74) *Attorney, Agent, or Firm*—Samuels, Gauthier & Stevens, LLP

(57) ABSTRACT

An amplifier circuit includes a first operational amplifier having an inverting input and a non-inverting input. The non-inverting input receives an input signal, and the inverting input is connected to a noise generating system. The amplifier circuit further includes a second operational amplifier having an inverting input and a non-inverting input. The non-inverting input of the second operational amplifier receives an input signal, and the inverting input is connected to a noise generating system. A differential in/out operational amplifier, in the amplifier circuit, has an inverting input connected to an output of the second operational amplifier and a non-inverting input connected to an output of the first operational amplifier. The noise generating system injects a narrow band noise into a differential amplifier with no insertion loss and mismatching along the signal path. The narrow band noise is obtained by amplifying thermal noise of an amplifier. The amplified thermal noise is bandwidth limited. The bandwidth limited amplified thermal noise is filtered by a low pass a filter.

24 Claims, 7 Drawing Sheets

DIFFERENTIAL INTERMEDIATE FREQUENCY (IF) AMPLIFIER WITH NARROW BAND NOISE DITHERING FOR DRIVING HIGH SPEED ANALOG-TO-DIGITAL CONVERSION AND COMMUNICATION APPLICATIONS

CLAIM FOR PRIORITY UNDER 35 U.S.C. §119(e)

The present application claims benefit under 35 U.S.C. §119(e) of U.S. Provisional Patent Application Serial No. 60/207,574, filed on May 26, 2000.

FIELD OF THE INVENTION

The present invention is directed to differential intermediate frequency amplifiers for driving analog to digital converting circuit or communication circuits. More specifically, the present invention is directed to differential intermediate frequency amplifiers including narrow band noise dithering for driving analog to digital converting circuit or communication circuits.

BACKGROUND OF THE INVENTION

Differential amplifiers have been widely used in communication applications due to their properties of even order harmonics cancellation and common mode noise rejection. An example of a conventional differential amplifier connected to a conventional analog to digital converting circuit is illustrated in FIG. 1.

FIG. 1 shows a pair of operational amplifiers 112 and 160 configured in a non-inverting mode for intermediate frequency ("IF") signals. Input signals are fed to the non-inverting inputs of the operational amplifiers 112 and 160 through resistors 106 and 152, respectively. The non-inverting inputs of the operational amplifiers 112 and 160 are also connected to ground through a pair of resistors (106, 108) and (152, 150), respectively. The output of the pair of operational amplifiers 112 and 160 are fed back to their respective inverting inputs through resistors 110 and 158, respectively.

The output of the operational amplifier 112 is fed to a non-inverting input of a differential in/out amplifier 120 through a resistor 114 and a capacitor 116 that are serially connected together. The output of the operational amplifier 160 is fed to an inverting input of differential in/out amplifier 120 through a resistor 162 and a capacitor 164 that are serially connected together.

The non-inverted output of the differential in/out amplifier 120 is fed to an input of an analog to digital converting circuit 140 through a resistor 126 and a capacitor 130 that are serially connected together. The inverted output of the differential in/out amplifier 120 is fed to an input of analog to digital converting circuit 140 through a resistor 124 and a capacitor 132 that are serially connected together. A capacitor 128 is connected across the center point of serially connected the resistor 126 and the capacitor 130, and serially connected the resistor 124 and, the capacitor 132. The non-inverted output of the differential in/out amplifier 120 is fed back to the inverted input of the differential in/out amplifier 120 through a resistor 118. The inverted output of the differential in/out amplifier 120 is fed back to the non-inverted input of the differential in/out amplifier 120 through a resistor 122.

Although differential amplifiers have been widely used to drive analog to digital converters and in communication applications, differential amplifiers only provide a limited spurious free dynamic range, thereby hindering optimization of these applications.

A conventional technique to improve a spurious free dynamic range is noise dithering. Noise dithering improves spurious free dynamic range of analog to digital converters by randomizing differential non-linearity of the analog to digital converter in its digitizing process.

However, such conventional dithering techniques have not been used with differential amplifiers because differential amplifiers have good common mode noise rejection, thereby making it difficult to combine or inject a dithering noise into the signal being amplified. Moreover, the injection of noise into a differential amplifier circuit can result in insertion loss and/or mismatching along the signal path.

It is desirable to enable a differential amplifier circuit that has the properties of even order harmonics cancellation and common mode noise rejection, as well as, an improved spurious free dynamic range.

SUMMARY OF THE INVENTION

One aspect of the present invention is directed to an amplifier circuit. The amplifier circuit includes an intermediate frequency signal circuit having an inverting input and a noise generating system connected to the inverting input of the intermediate frequency signal circuit.

Another aspect of the present invention is directed to an analog to digital conversion circuit. The analog to digital conversion circuit includes an intermediate frequency signal circuit having an inverting input; a noise generating system connected to the inverting input of the intermediate frequency signal circuit; and an analog to digital conversion circuit connected to the intermediate frequency signal circuit.

A third aspect of the present invention is directed to a method of amplifying an input signal. The method differentially amplifies an input signal using a differential amplifying circuit; feeds back an output signal of the differential amplifying circuit to an inverting input of the differential amplifying circuit; and injects a narrow band noise signal into the feedback signal being fed to an inverting input of the differential amplifying circuit.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention; wherein.

DETAILED DESCRIPTION OF THE INVENTION

Figure 1:
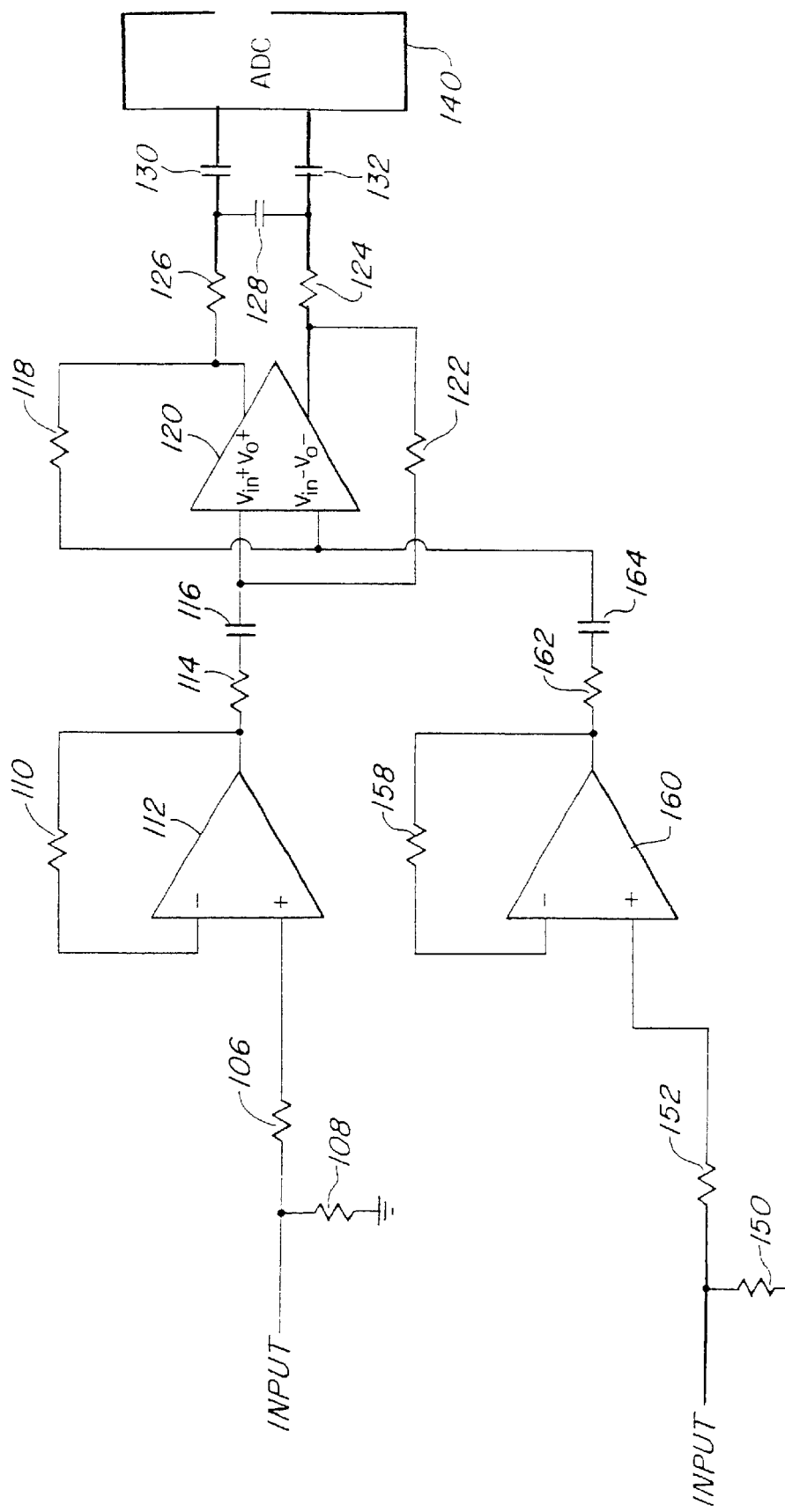
FIG. 1 illustrates a conventional differential amplifier circuit for driving an analog to digital circuit.
Figure 2:
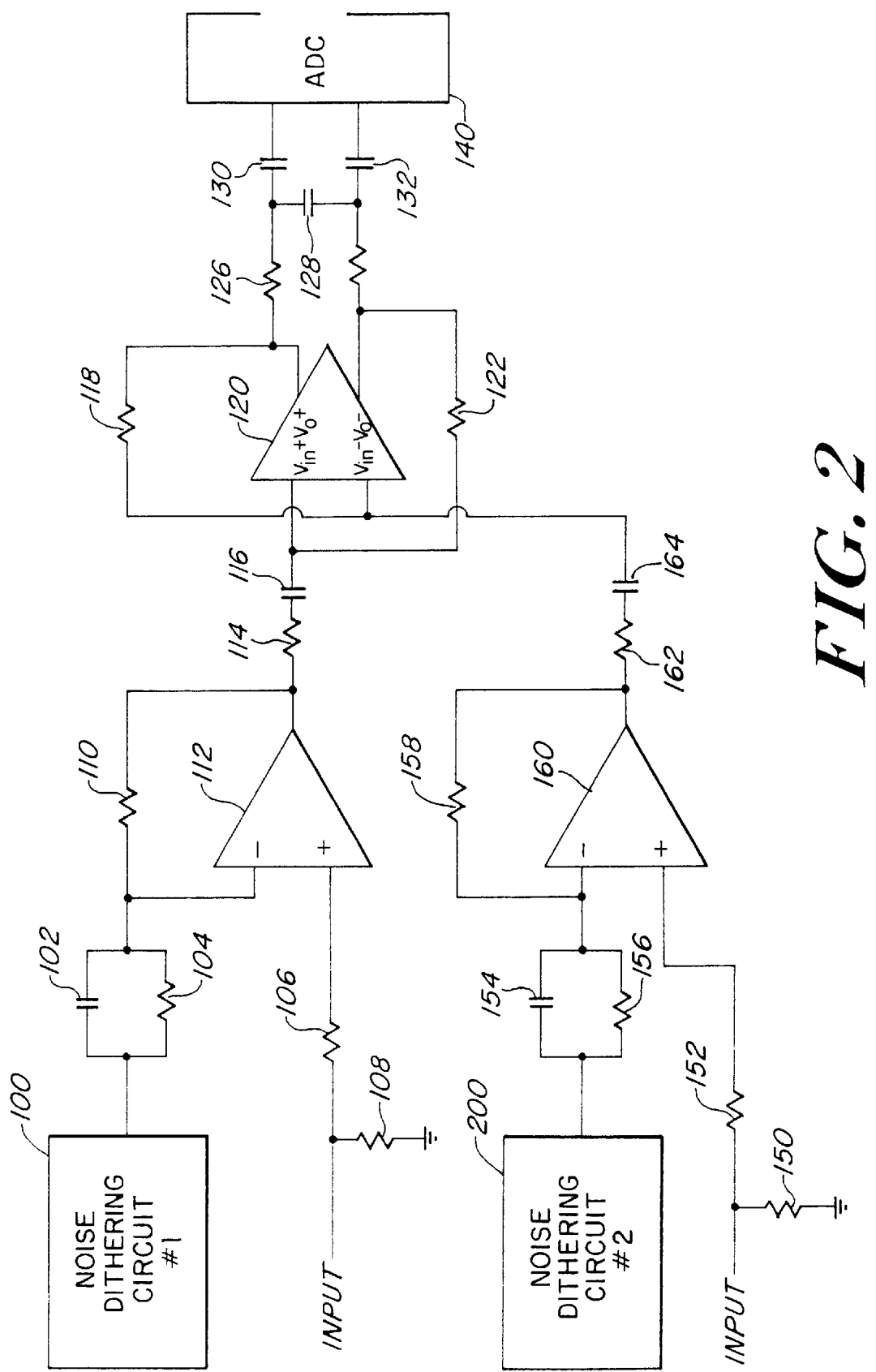
FIG. 2 illustrates a noise injected differential amplifier circuit for driving an analog to digital circuit according to an embodiment of the present invention.

FIG. 2 illustrates one embodiment of the present invention. FIG. 2 shows a pair of operational amplifiers 112 and 160 configured in a non-inverting mode for intermediate frequency ("IF") signals. Input signals are fed to the non-inverting inputs of the operational amplifiers 112 and 160 through resistors 106 and 152, respectively. The non-inverting inputs of the operational amplifiers 112 and 160 are also connected to ground through a pair of resistors (106, 108) and (152, 150), respectively. The output of the pair of operational amplifiers 112 and 160 are fed back to their respective inverting inputs through resistors 110 and 158, respectively.

The inverting input of operational amplifier 112 is connected to a first noise dithering (generating) circuit 100 through a parallel circuit of a resistor 104 and a capacitor 102. The inverting input of operational amplifier 160 is connected to a second noise dithering (generating) circuit 200 through a parallel circuit of a resistor 156 and a capacitor 154.

The output of the operational amplifier 112 is fed to a non-inverting input of a differential in/out amplifier 120 through a resistor 114 and a capacitor 116 that are serially connected together. The output of the operational amplifier 160 is fed to an inverting input of differential in/out amplifier 120 through a resistor 162 and a capacitor 164 that are serially connected together.

The non-inverted output of the differential in/out amplifier 120 is fed to an input of an analog to digital converting circuit 140 through a resistor 126 and a capacitor 130 that are serially connected together. The inverted output of the differential in/out amplifier 120 is fed to an input of analog to digital converting circuit 140 through a resistor 124 and a capacitor 132 that are serially connected together. A capacitor 128 is connected across the center point of serially connected the resistor 126 and the capacitor 130, and serially connected the resistor 124 and the capacitor 132. The non-inverted output of the differential in/out amplifier 120 is fed back to the inverted input of the differential in/out amplifier 120 through a resistor 118. The inverted output of the differential in/out amplifier 120 is fed back to the non-inverted input of the differential in/out amplifier 120 through a resistor 122.

In FIG. 2, operational amplifiers 112 and 160 act as summing nodes for the signal and dithering noise. The operational amplifiers 112 and 160 also provide a high isolation for the signal and dithering noise, so that there is no insertion loss induced from the noise generating circuitry 100 or 200 or (300). The non-inverting inputs of operational amplifiers 112 and 160 are of high impedance; therefore, the non-inverting inputs of operational amplifiers 112 and 160 can be easily terminated to any desired impedance to match with the source impedance. The non-inverting input termination is not affected by the connection of the noise generating circuitry 100 or 200 or (300). The operational amplifiers 112 and 160 also improve the isolation of the differential in/out amplifier 120, whose inputs will see constant impedance.

Furthermore, resistors 126 and 124 and capacitor 128 provide the differential filter and the dominant pole before the analog to digital circuit 140 to reduce the bandwidth of the differential in/out amplifier 120, which in a preferred embodiment is a 1 Ghz differential in/out amplifier, to $1/(2\pi*2RC)$, and therefore, it maximizes signal to noise ratio+spurious free dynamic range ("SNR+SFDR"). The differential filter (resistors 126 and 124 and capacitor 128) is not referenced to ground so there is no common mode noise from ground to either inputs of the analog to digital circuit 140. Since the differential filter (resistors 126 and 124 and capacitor 128) is done with only one capacitor, it can save on components and can provide excellent phase and gain matching between the differential inputs of the driven circuits.

The resistors 126 and 124 in the differential filter (resistors 126 and 124 and capacitor 128) also act as a current limiter in the time domain to provide a series isolation resistor for over-voltage signals into the analog to digital circuit 140. At the same time, the resistance offers damping of the differential in/out amplifier 120 driving a capacitive load. This resistance also provides a 1/R slope for current to keep it below the Imax into the analog to digital circuit 140 clamps and thus produces no foldover.

Figure 3:
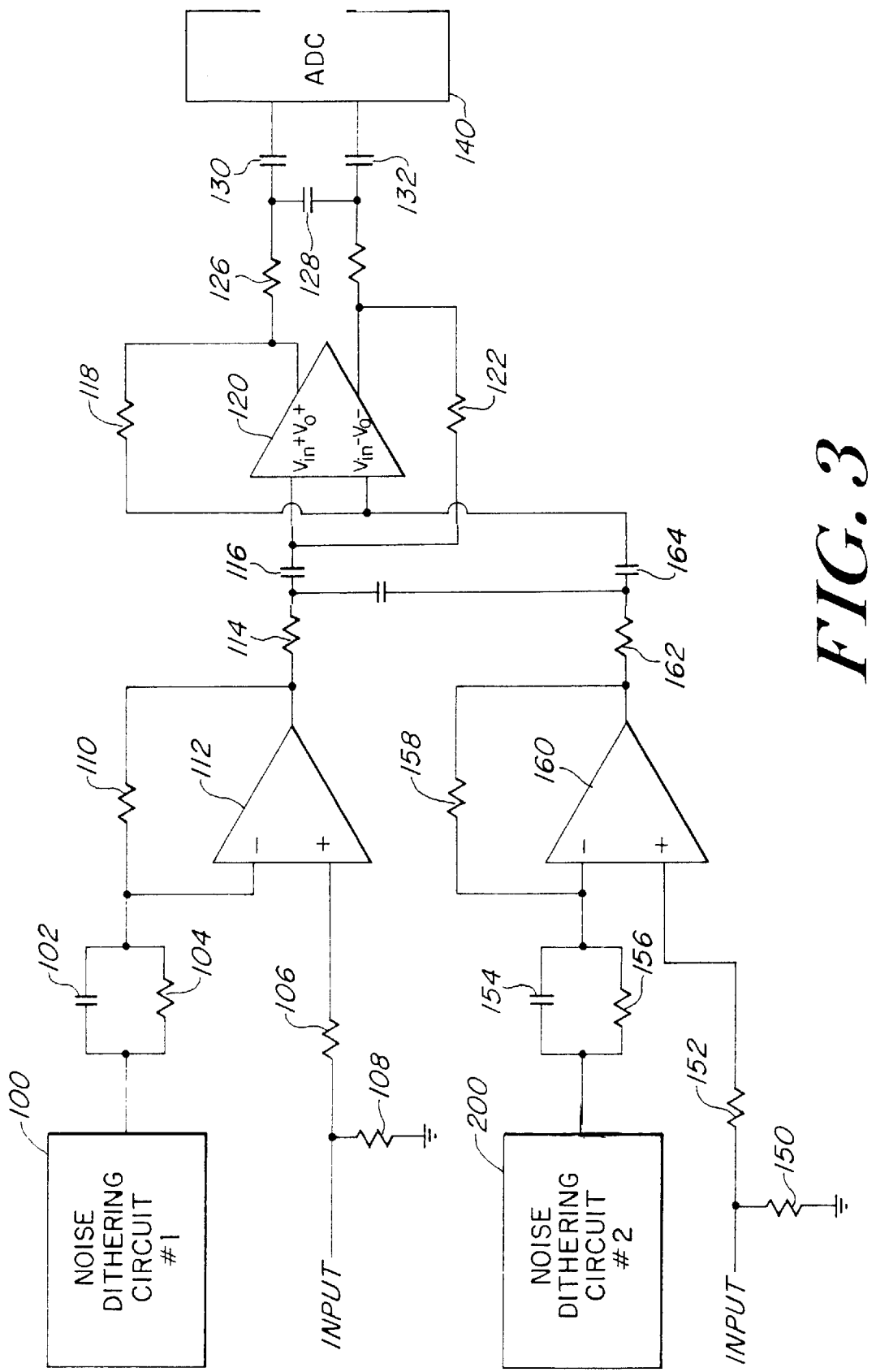
FIG. 3 illustrates a noise injected differential amplifier circuit for driving an analog to digital circuit according to another embodiment of the present invention.

FIG. 3 illustrates another embodiment of the present invention. FIG. 3 shows a pair of operational amplifiers 112 and 160 configured in a non-inverting mode for intermediate frequency ("IF") signals. Input signals are fed to the non-inverting inputs of the operational amplifiers 112 and 160 through resistors 106 and 152, respectively. The non-inverting inputs of the operational amplifiers 112 and 160 are also connected to ground through a pair of resistors (106, 108) and (152, 150), respectively. The output of the pair of operational amplifiers 112 and 160 are fed back to their respective inverting inputs through resistors 110 and 158, respectively.

The inverting input of operational amplifier 112 is connected to a first noise dithering (generating), circuit 100 through a parallel circuit of a resistor 104 and a capacitor 102. The inverting input of operational amplifier 160 is connected to a second noise dithering (generating) circuit 200 through a parallel circuit of a resistor 156 and a capacitor 154.

The output of the operational amplifier 112 is fed to a non-inverting input of a differential in/out amplifier 120 through a resistor 114 and a capacitor 116 that are serially connected together. The output of the operational amplifier 160 is fed to an inverting input of differential in/out amplifier 120 through a resistor 162 and a capacitor 164 that are serially connected together. A capacitor 170 is connected across the output of operational amplifier 112 and the output of operational amplifier 160.

The non-inverted output of the differential in/out amplifier 120 is fed to an input of an analog to digital converting circuit 140 through a resistor 126 and a capacitor 130 that are serially connected together. The inverted output of the differential in/out amplifier 120 is fed to an input of analog to digital converting circuit 140 through a resistor 124 and a capacitor 132 that are serially connected together. A capacitor 128 is connected across the center point of serially connected the resistor 126 and the capacitor 130, and serially connected the resistor 124 and the capacitor 132. The non-inverted output of the differential in/out amplifier 120 is fed back to the inverted input of the differential in/out amplifier 120 through a resistor 118. The inverted output of the differential in/out amplifier 120 is fed back to the non-inverted input of the differential in/out amplifier 120 through a resistor 122.

In FIG. 3, operational amplifiers 112 and 160 act as summing nodes for the signal and dithering noise. The operational amplifiers 112 and 160 also provide a high isolation for the signal and dithering noise, so that there is no insertion loss induced from the noise generating circuitry 100 or 200 or (300). The non-inverting inputs of operational amplifiers 112 and 160 are of high impedance; therefore, the non-inverting inputs of operational amplifiers 112 and 160 can be easily terminated to any desired impedance to match with the source impedance. The non-inverting input termination is not affected by the connection of the noise generating circuitry 100 or 200 or (300). The operational amplifiers 112 and 160 also improve the isolation of the differential in/out amplifier 120, whose inputs will see constant impedance.

Furthermore, resistors 126 and 124 and capacitor 128 provide the differential filter and the dominant pole before the analog to digital circuit 140 to reduce the bandwidth of the differential in/out amplifier 120, which in a preferred embodiment is a 1 Ghz differential in/out amplifier, to $1/(2\pi*2RC)$, and therefore, it maximizes signal to noise ratio+spurious free dynamic range ("SNR+SFDR"). The differential filter (resistors 126 and 124 and capacitor 128) is not referenced to ground so there is no common mode noise from ground to either inputs of the analog to digital circuit 140. Since the differential filter (resistors 126 and 124 and capacitor 128) is done with only one capacitor, it can save on components and can provide excellent phase and gain matching between the differential inputs of the driven circuits.

The resistors 126 and 124 in the differential filter (resistors 126 and 124 and capacitor 128) also act as a current limiter in the time domain to provide a series isolation resistor for over-voltage signals into the analog to digital circuit 140. At the same time, the resistance offers damping of the differential in/out amplifier 120 driving a capacitive load. This resistance also provides a 1/R slope for current to keep it below the Imax into the analog to digital circuit 140 clamps and thus produces no foldover.

Figure 4:
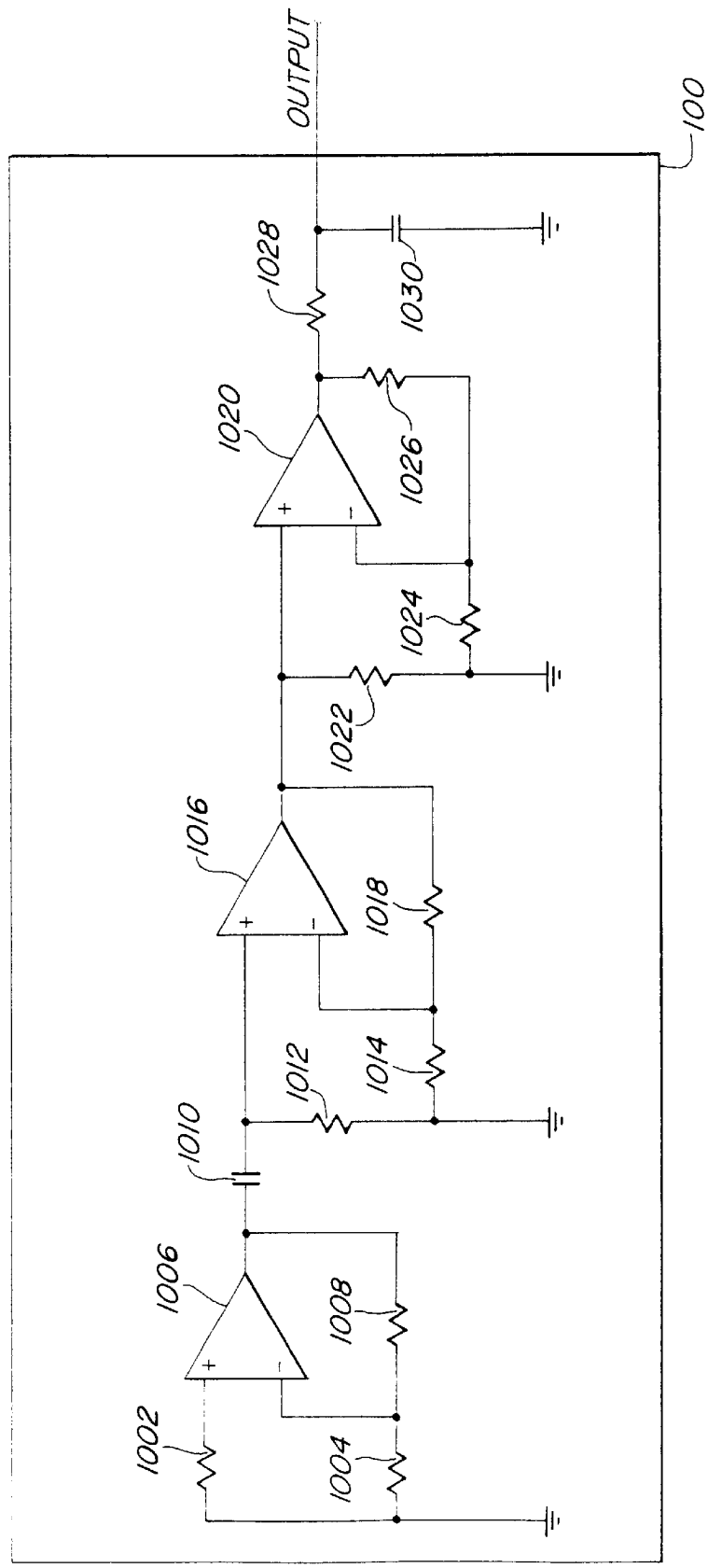
FIG. 4 illustrates a detail schematic of a first noise generating circuit as illustrated in FIG. 2 according to an embodiment of the present invention.
Figure 7:
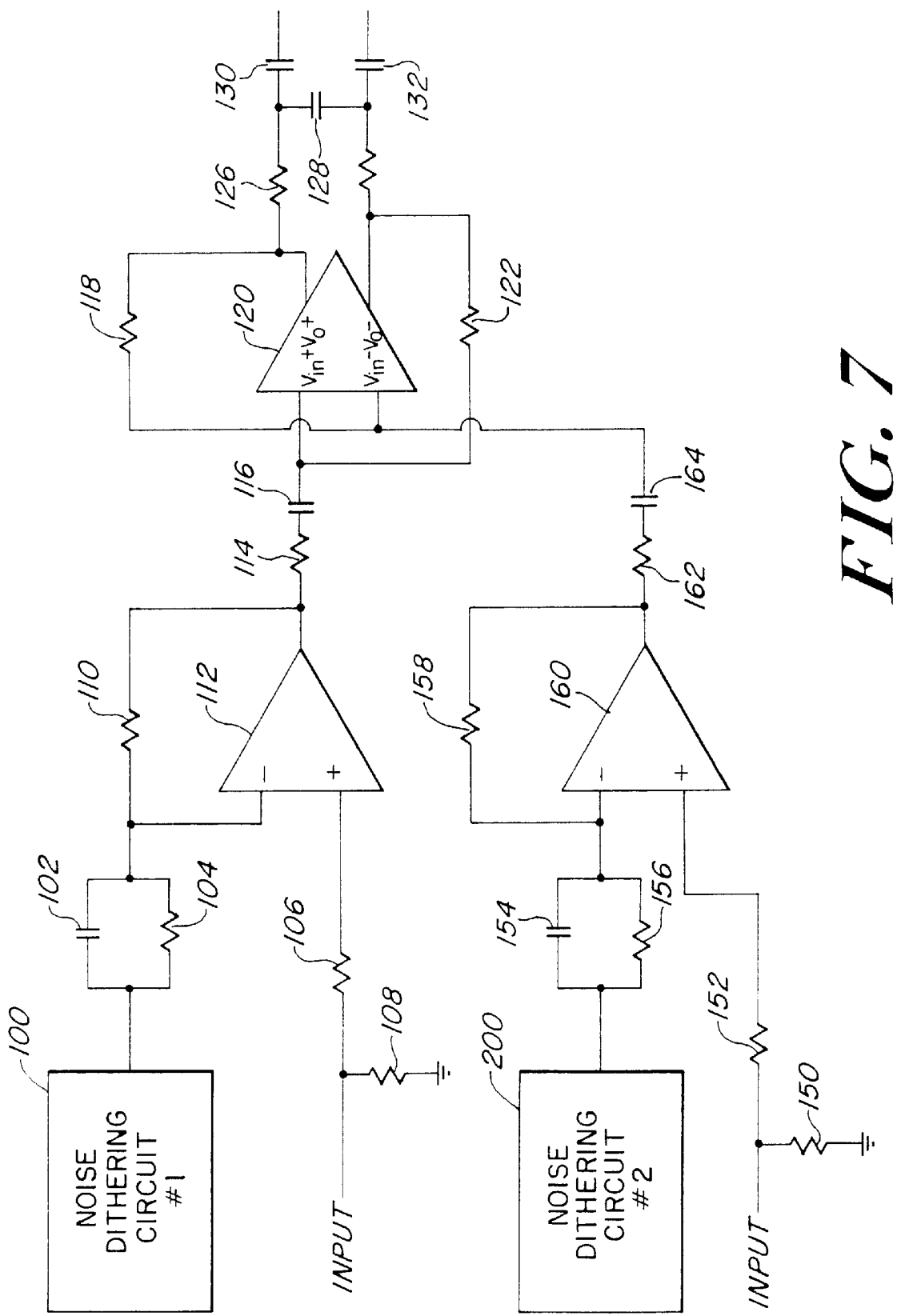
FIG. 7 illustrates a noise injected differential amplifier circuit for a communication application according to an embodiment of the present invention.

FIG. 4 illustrates, in more detail, the noise dithering circuit 100 of FIGS. 2, 3, and 7. As illustrated in FIG. 4, the noise dithering circuit 100 includes an amplifier 1006. Inverting input and non-inverting input of an amplifier 1006 are connected to ground via resistors 1004 and 1002, respectively. The output of amplifier 1006 is fed to a non-inverting input of an amplifier 1016 through a capacitor 1010. The output of amplifier 1006 is also fed back to its inverting input through resistor 1008.

Inverting input and non-inverting input of amplifier 1016 are connected to ground via resistors 1014 and 1012, respectively. The output of amplifier 1016 is fed to a non-inverting input of an amplifier 1020. The output of amplifier 1016 is also fed back to its inverting input through resistor 1018.

Inverting input and non-inverting input of amplifier 1020 are connected to ground via resistors 1024 and 1022, respectively. The output of amplifier 1020 is fed to a low pass filter comprising a resistor 1028 and capacitor 1030. The output of amplifier 1020 is also fed back to its inverting input through resistor 1026.

Generally speaking, the narrow band dithering noise is obtained by limiting the amplifier bandwidth of the noise generating circuitry, and connecting a passive low-pass filter at its output.

The present invention injects a narrow band noise generated from a noise generator into a differential amplifier with no insertion loss and mismatching along the signal path. The narrow band noise is obtained by amplifying the thermal noise of the first amplifier 1006 of FIG. 4. The amplified thermal noise from amplifier 1006 is bandwidth limited by the second and third amplifiers 1016 and 1020. The bandwidth limited amplified thermal noise is filtered by the low pass R-C filter (resistor 1028 and capacitor 1030).

The noise generating circuit 100 uses three amplifiers 1006, 1016, and 1020. Gain in the noise generating circuit 100 is achieved though three stage amplifiers 1006, 1016, and 1020 to provide enough noise power for dithering. At the same time, the gain sets the bandwidth of the noise generating circuitry 100.

The noise generating circuitry 100 can be turned on or off through its power supply if a separate power is used. This gives a control in the case that such a dithering on/off is needed by the system design.

Figure 5:
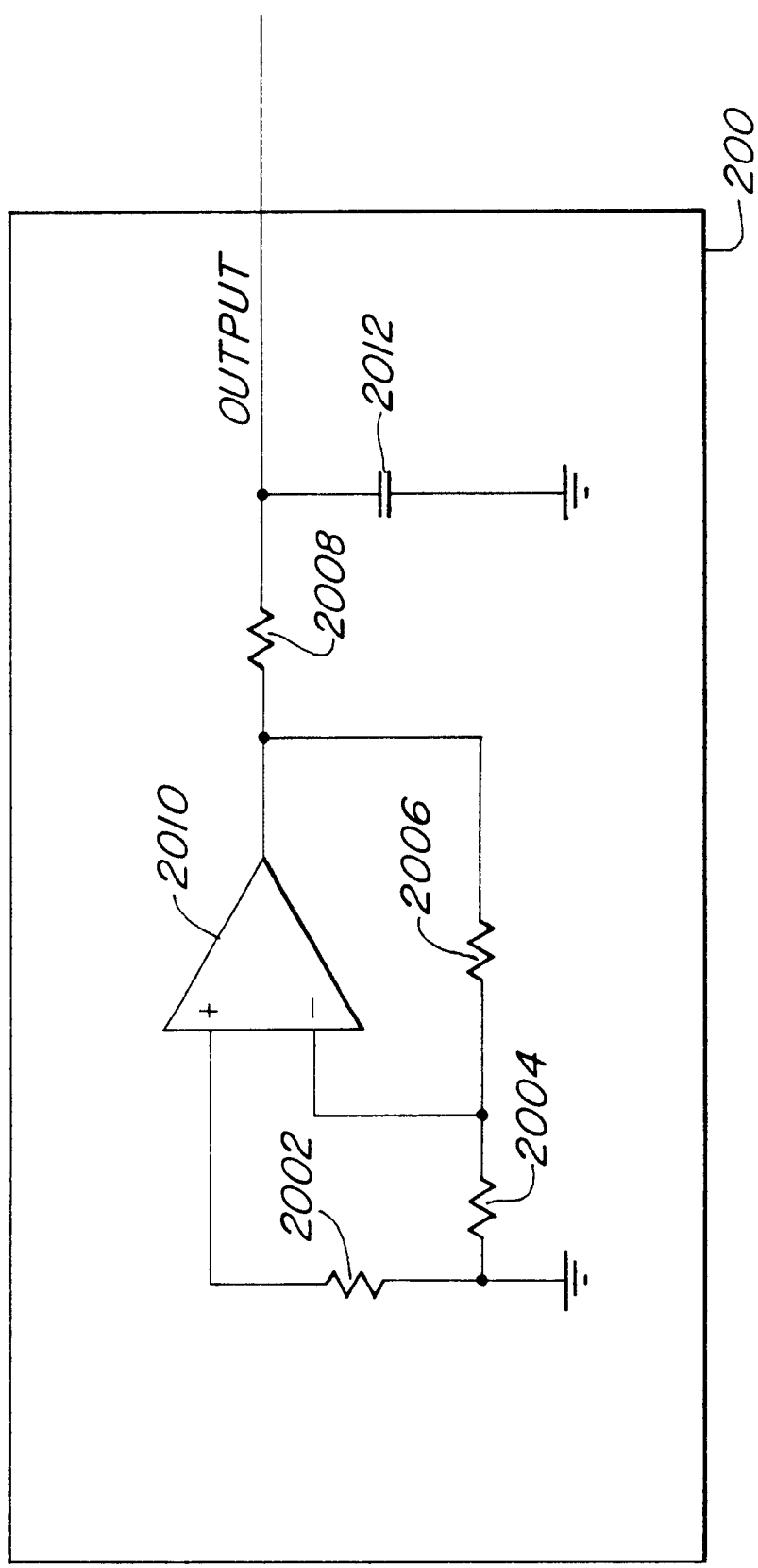
FIG. 5 illustrates a detail schematic of a second noise generating circuit as illustrated in FIG. 2 according to an embodiment of the present invention.

FIG. 5 illustrates, in more detail, the noise dithering circuit 200 of FIGS. 2, 3, and 7. As illustrated in FIG. 5, the noise dithering circuit 200 includes an amplifier 2010. Inverting input and non-inverting input of an amplifier 2010 are connected to ground via resistors 2004 and 2002, respectively. The output of amplifier 2010 is fed to a low pass filter comprising a resistor 2008 and capacitor 2012. The output of amplifier 2010 is also fed back to its inverting input through resistor 2006.

To keep the symmetry of the differential path, the noise generating circuit 200 is used. Using the second noise generating circuit 200 enables the circuit to avoid insertion loss and mismatching in the signal path. The injected noise signals are non-correlated, thereby enabling the dithering noise to be mixed effectively into IF signals.

The noise generating circuitry 200 can be turned on or off through its power supply if a separate power is used. This gives a control in the case that such a dithering on/off is needed by the system design.

Figure 6:
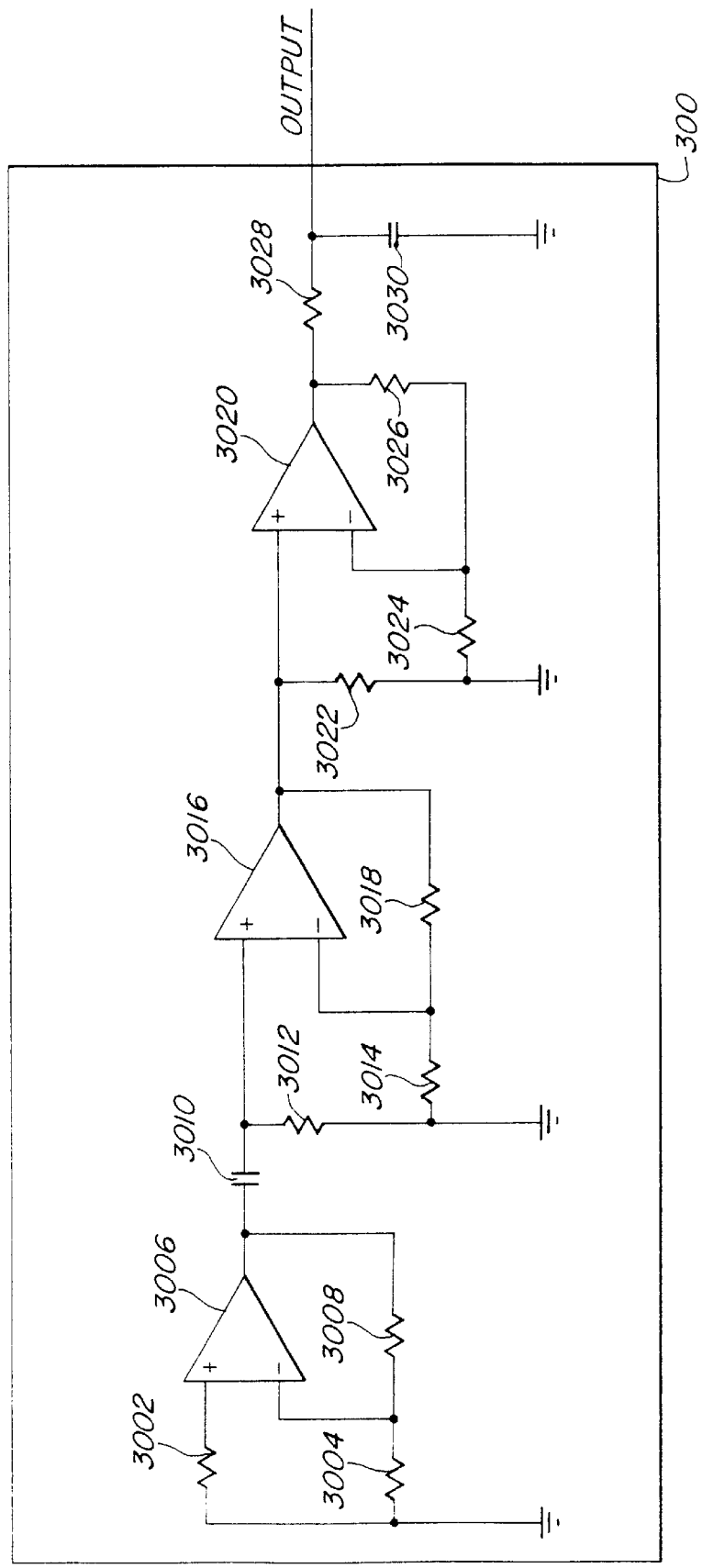
FIG. 6 illustrates a detail schematic of a second noise generating circuit as illustrated in FIG. 2 according to another embodiment of the present invention.

FIG. 6 illustrates, in more detail, another embodiment of the noise dithering circuit 200 of FIGS. 2, 3, and 7 for use with higher noise power requirements. As illustrated in FIG. 6, the noise dithering circuit 300 includes an amplifier 3006. Inverting input and non-inverting input of an amplifier 3006 are connected to ground via resistors 3004 and 3002, respectively. The output of amplifier 3006 is fed to a non-inverting input of an amplifier 3016 through a capacitor 3010. The output of amplifier 3006 is also fed back to its inverting input through resistor 3008.

Inverting input and non-inverting input of amplifier 3016 are connected to ground via resistors 3014 and 3012, respectively. The output of amplifier 3016 is fed to a non-inverting input of an amplifier 3020. The output of amplifier 3016 is also fed back to its inverting input through resistor 3018.

Inverting input and non-inverting input of amplifier 3020 are connected to ground via resistors 3024 and 3022, respectively. The output of amplifier 3020 is fed to a low pass filter comprising a resistor 3028 and capacitor 3030. The output of amplifier 3020 is also fed back to its inverting input through resistor 3026.

The noise generating circuitry 300 can be turned on or off through its power supply if a separate power is used. This gives a control in the case that such a dithering on/off is needed by the system design.

FIG. 7 illustrates another embodiment of the present invention. FIG. 7 shows a pair of operational amplifiers 112 and 160 configured in a non-inverting mode for intermediate frequency ("IF") signals. Input signals are fed to the non-inverting inputs of the operational amplifiers 112 and 160 through resistors 106 and 152, respectively. The non-inverting inputs of the operational amplifiers 112 and 160 are also connected to ground through a pair of resistors (106, 108) and (152, 150), respectively. The output of the pair of operational amplifiers 112 and 160 are fed back to their respective inverting inputs through resistors 110 and 158, respectively.

The inverting input of operational amplifier 112 is connected to a first noise dithering (generating) circuit 100 through a parallel circuit of a resistor 104 and a capacitor 102. The inverting input of operational amplifier 160 is connected to a second noise dithering (generating) circuit 200 through a parallel circuit of a resistor 156 and a capacitor 154.

The output of the operational amplifier 112 is fed to a non-inverting input of a differential in/out amplifier 120 through a resistor 114 and a capacitor 116 that are serially connected together. The output of the operational amplifier 160 is fed to an inverting input of differential in/out amplifier 120 through a resistor 162 and a capacitor 164 that are serially connected together.

The non-inverted output of the differential in/out amplifier 120 is fed to an input of a communication circuit (not shown) through a resistor 126 and a capacitor 130 that are serially connected together. The inverted output of the differential in/out amplifier 120 is fed to an input of analog to digital converting circuit 140 through a resistor 124 and a capacitor 132 that are serially connected together. A capacitor 128 is connected across the center point of serially connected the resistor 126 and the capacitor 130, and serially connected the resistor 124 and the capacitor 132. The non-inverted output of the differential in/out amplifier 120 is fed back to the inverted input of the differential in/out amplifier 120 through a resistor 118. The inverted output of the differential in/out amplifier 120 is fed back to the non-inverted input of the differential in/out amplifier 120 through a resistor 122.

In FIG. 7, operational amplifiers 112 and 160 act as summing nodes for the signal and dithering noise. The operational amplifiers 112 and 160 also provide a high isolation for the signal and dithering noise, so that there is no insertion loss induced from the noise generating circuitry 100 or 200 or (300). The non-inverting inputs of operational amplifiers 112 and 160 are of high impedance; therefore, the non-inverting inputs of operational amplifiers 112 and 160 can be easily terminated to any desired impedance to match with the source impedance. The non-inverting input termination is not affected by the connection of the noise generating circuitry 100 or 200 or (300). The operational amplifiers 112 and 160 also improve the isolation of the differential in/out amplifier 120, whose inputs will see constant impedance.

Furthermore, resistors 126 and 124 and capacitor 128 provide the differential filter and the dominant pole before a communication circuit or load to reduce the bandwidth of the differential in/out amplifier 120, which in a preferred embodiment is a 1 Ghz differential in/out amplifier, to $1/(2\pi*2RC)$, and therefore, it maximizes signal to noise ratio+spurious free dynamic range ("SNR+SFDR"). The. Differential filter (resistors 126 and 124 and capacitor 128) is not referenced to ground so there is no common mode noise from ground to either inputs of communication circuit or load. Since the differential filter (resistors 126 and 124 and capacitor 128) is done with only one capacitor, it can save on components and can provide excellent phase and gain matching between the differential inputs of the driven circuits.

The resistors 126 and 124 in the differential filter (resistors 126 and 124 and capacitor 128) also act as a current limiter in the time domain to provide a series isolation resistor for over-voltage signals into the communication circuit or load. At the same time, the resistance offers damping of the differential in/out amplifier 120 driving a capacitive load.

In summary, the present invention uses a differential amplifier with dithered noise added indirectly into the IF signal path. The present invention does not cause any insertion loss. Moreover, the present invention does not introduce any mismatching in signal path. In the illustrated embodiments, both the signal and noise circuits are isolated from each other.

While various examples and embodiments of the present invention have been shown and described, it will be appreciated by those skilled in the art that the spirit and scope of the present invention are not limited to the specific description and drawings herein, but extend to various modifications and changes all as set forth in the following claims.

What is claimed is:

1. An amplifier circuit, comprising:
   an intermediate frequency signal circuit having an inverting input; and
   a noise generating system connected to the inverting input of said intermediate frequency signal circuit;
   said intermediate frequency signal circuit including,
      a first operational amplifier having an inverting input and a non-inverting input, said non-inverting input receiving an input signal, said inverting input being connected to said noise generating system;
      a second operational amplifier having an inverting input and a non-inverting input, said non-inverting input receiving an input signal; and
      a differential in/out operational amplifier having an inverting input connected to an output of said second operational amplifier and a non-inverting input connected to an output of said first operational amplifier.

2. The amplifier circuit as claimed in claim 1, wherein said noise generating system includes a first noise generating circuit and a-second noise generating circuit;
   said inverting input of said first operational amplifier is connected to said first noise generating circuit; and
   said inverting input of said second operational amplifier is connected to said second noise generating circuit.

3. The amplifier circuit as claimed in claim 1, wherein said first noise generating circuit includes a dual operational amplifier.

4. The amplifier circuit as claimed in claim 1, wherein said second noise generating circuit includes a dual operational amplifier.

5. The amplifier circuit as claimed in claim 3, wherein said second noise generating circuit includes a dual operational amplifier.

6. The amplifier circuit as claimed in claim 3, wherein said first noise generating circuit includes a first noise operational amplifier and a second noise operational amplifier connected in series, an output of said second noise operational amplifier connected to a non-inverting input of said dual operational amplifier of said first noise generating circuit.

7. The amplifier circuit as claimed in claim 5, wherein said first noise generating circuit includes a first noise operational amplifier and a second noise operational amplifier connected in series, an output of said second noise operational amplifier connected to a non-inverting input of said dual operational amplifier of said first noise generating circuit.

8. The amplifier circuit as claimed in claim 4, wherein said second noise generating circuit includes a first noise operational amplifier and a second noise operational amplifier connected in series, an output of said second noise operational amplifier connected to a non-inverting input of said dual operational amplifier of said second noise generating circuit.

9. The amplifier circuit as claimed in claim 7, wherein said second noise generating circuit includes a first noise operational amplifier and a second noise operational amplifier connected in series, an output of said second noise operational amplifier connected to a non-inverting input of said dual operational amplifier of said second noise generating circuit.

10. The amplifier circuit as claimed in claim 1, further comprising a capacitor connected between an output of said first operational amplifier and an output of said second operational amplifier.

11. An analog to digital conversion circuit, comprising:
   an intermediate frequency signal circuit having an inverting input;
   a noise generating system connected to the inverting input of said intermediate frequency signal circuit; and
   an analog to digital conversion circuit connected to said intermediate frequency signal circuit;
   said intermediate frequency signal circuit including,
      a first operational amplifier having an inverting input and a non-inverting input, said non-inverting input receiving an input signal, said inverting input being connected to said noise generating system;
      a second operational amplifier having an inverting input and a non-inverting input, said non-inverting input receiving an input signal; and
      a differential in/out operational amplifier having an inverting input connected to an output of said second operational amplifier and a non-inverting input connected to an output of said first operational amplifier, an inverting output of said differential in/out operational amplifier and a non-inverting output of said differential in/out operational amplifier being connected to said analog to digital conversion circuit.

12. The analog to digital conversion circuit as claimed in claim 11, wherein said noise generating system includes a first noise generating circuit and a second noise generating circuit;
   said inverting input of said first operational amplifier is connected to said first noise generating circuit; and
   said inverting input of said second operational amplifier is connected to said second noise generating circuit.

13. The analog to digital conversion circuit as claimed in claim 11, wherein said first noise generating circuit includes a dual operational amplifier.

14. The analog to digital conversion circuit as claimed in claim 11, wherein said second noise generating circuit includes a dual operational amplifier.

15. The analog to digital conversion circuit as claimed in claim 13, wherein said second noise generating circuit includes a dual operational amplifier.

16. The analog to digital conversion circuit as claimed in claim 13, wherein said first noise generating circuit includes a first noise operational amplifier and a second noise operational amplifier connected in series, an output of said second noise operational amplifier connected to a non-inverting input of said dual operational amplifier of said first noise generating circuit.

17. The analog to digital conversion circuit as claimed in claim 15, wherein said first noise generating circuit includes a first noise operational amplifier and a second noise operational amplifier connected in series, an output of said second noise operational amplifier connected to a non-inverting input of said dual operational amplifier of said first noise generating circuit.

18. The analog to digital conversion circuit as claimed in claim 14, wherein said second noise generating circuit includes a first noise operational amplifier and a second noise operational amplifier connected in series, an output of said second noise operational amplifier connected to a non-inverting input of said dual operational amplifier of said second noise generating circuit.

19. The analog to digital conversion circuit as claimed in claim 17, wherein said second noise generating circuit includes a first noise operational amplifier and a second noise operational amplifier connected in series, an output of said second noise operational amplifier connected to a non-inverting input of said dual operational amplifier of said second noise generating circuit.

20. The analog to digital conversion circuit as claimed in claim 11, further comprising a capacitor connected between an output of said first operational amplifier and an output of said second operational amplifier.

21. A method of amplifying an input signal, comprising:
   (a) differentially amplifying an input signal using a differential amplifying circuit having a first operational amplifier having an inverting input and a non-inverting input wherein the non-inverting input receiving the input signal and the inverting input being connected to the output of the first operational amplifier and receiving the injected narrow band noise signal, a second operational amplifier having an inverting input and a non-inverting input wherein the non-inverting input receiving the input signal, and a differential in/out operational amplifier having an inverting input connected to an output of the second operational amplifier and a non-inverting input connected to an output of the first operational amplifier;
   (b) feeding back an output signal of the differential amplifying circuit to an inverting input of the differential amplifying circuit; and
   (c) injecting a narrow band noise signal into the feedback signal being fed to an inverting input of the differential amplifying circuit.

22. The method as claimed in claim 21, wherein the narrow band noise signal is generated by amplifying a thermal noise of an operational amplifier, limiting a bandwidth of the amplified thermal noise, and low pass filtering the bandwidth limited signal.

23. The method as claimed in claim 21, wherein the narrow band noise signal is generated by amplifying a thermal noise of an operational amplifier, limiting a bandwidth of the amplified thermal noise, low pass filtering the bandwidth limited signal, and injecting the low pass filtered signal into the inverting input of the first operational amplifier.

24. The method as claimed in claim 21, further comprising:
   (d) converting the output signal of the differential amplifying circuit to a digital signal.

* * * * *